(12) United States Patent
Yajima

(10) Patent No.: US 10,611,572 B2
(45) Date of Patent: Apr. 7, 2020

(54) RECHARGE TUBE STOCKER

(71) Applicant: SHIN-ETSU HANDOTAI CO., LTD., Tokyo (JP)

(72) Inventor: Wataru Yajima, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 59 days.

(21) Appl. No.: 15/781,505

(22) PCT Filed: Dec. 12, 2016

(86) PCT No.: PCT/JP2016/005107
§ 371 (c)(1),
(2) Date: Jun. 5, 2018

(87) PCT Pub. No.: WO2017/119029
PCT Pub. Date: Jul. 13, 2017

(65) Prior Publication Data
US 2018/0273299 A1 Sep. 27, 2018

(30) Foreign Application Priority Data
Jan. 5, 2016 (JP) .................................. 2016-000671

(51) Int. Cl.
B65G 1/16 (2006.01)
C30B 29/06 (2006.01)
(Continued)

(52) U.S. Cl.
CPC ................ B65G 1/16 (2013.01); C30B 15/00 (2013.01); C30B 15/02 (2013.01); C30B 29/06 (2013.01)

(58) Field of Classification Search
CPC .... B65B 1/32; B65B 1/28; B65G 1/16; C30B 15/02
See application file for complete search history.

(56) References Cited

U.S. PATENT DOCUMENTS

| 4,053,001 A * | 10/1977 | Healey ................... A62C 13/76 141/2 |
| 5,855,232 A | 1/1999 | Oda et al. |
| 2005/0034430 A1* | 2/2005 | Holzlwimmer ........... B65B 1/28 53/469 |

FOREIGN PATENT DOCUMENTS

| JP | H05-278617 A | 10/1993 |
| JP | H09-227271 A | 9/1997 |

(Continued)

OTHER PUBLICATIONS

Feb. 7, 2017 International Search Report issued in International Patent Application No. PCT/JP2016/005107.

(Continued)

Primary Examiner — Timothy P. Kelly
(74) Attorney, Agent, or Firm — Oliff PLC

(57) ABSTRACT

A recharge tube stocker for storing and managing a recharge tube used for a single crystal pulling apparatus, including an inlet-outlet section for taking the recharge tube in the recharge tube stocker and taking the recharge tube out of the recharge tube stocker, a storage for storing the recharge tube, a raw-material charging device for charging the recharge tube with a raw material, a weighing device for weighing a weight of the raw material charged into the recharge tube, a transferring device for enabling a transfer of the recharge tube, being taken in through the inlet-outlet section, among the inlet-outlet section, the raw-material charging device, and the storage, and a managing device for collectively managing storage information on the recharge tube stored in the storage. This recharge tube stocker stores and manages tubes in a space saving manner without taking time for searching and without causing mix-up of recharge tubes.

19 Claims, 4 Drawing Sheets

(51) Int. Cl.
*C30B 15/02* (2006.01)
*C30B 15/00* (2006.01)

(56) References Cited

FOREIGN PATENT DOCUMENTS

| | | |
|---|---|---|
| JP | 2000-095306 A | 4/2000 |
| JP | 2001-075610 A | 3/2001 |
| JP | 2007-253651 A | 10/2007 |

OTHER PUBLICATIONS

Nagata, Yoshio, Kikuchi, Jun'ichiro, "Construction cases of the multi-itemed and small-volume weighing system and its points", Instrumentation, 1994, vol. 37, No. 7, pp. 46-51.

* cited by examiner

RECHARGE TUBE STOCKER

TECHNICAL FIELD

The present invention relates to a recharge tube stocker for storing and managing a recharge tube used for a single crystal pulling apparatus such as a silicon single crystal pulling apparatus.

BACKGROUND ART

In order to pull a silicon single crystal and so on continuously by Czochralski method, for example, the crucible has to be successively charged with polycrystalline silicon nuggets, which becomes a raw material, for each time when the amount of the raw material melt in the crucible becomes a prescribed amount or less.

To charge this crucible with a raw material, recharge tubes have been used conventionally. This recharge tube has a cylindrical structure, and can be charged with a raw material (e.g., polycrystalline silicon).

When recharge tubes are charged with a polycrystalline raw material, each recharge tube is separately loaded onto an exclusive carriage (see, e.g., Patent Literature 1), and is charged with a prescribed amount of the polycrystalline raw material while the raw material is being weighed on the carriage (see, e.g., Patent Literature 2).

Then, the recharge tube having been charged with the raw material is stored and managed while loaded on the carriage. The management of information including the kind of raw material for use and the charged amount is performed by human hands.

CITATION LIST

Patent Literature

Patent Literature 1: Japanese Unexamined Patent Application Publication No. H05-278617
Patent Literature 2: Japanese Unexamined Patent Application Publication No. H09-227271

SUMMARY OF INVENTION

Problem to be Solved by the Invention

For storing and managing recharge tubes, accordingly, it is necessary to provide carriages as many as recharge tubes and a space for parking the carriages. Additionally, withdrawing a required recharge tube takes time for searching for the recharge tube and involves a risk for causing mix-up.

The present invention is made in view of the above problems. It is an object of the present invention to provide a recharge tube stocker that allows recharge tubes to be stored and managed in a space saving manner without taking time for searching for a required recharge tube and without causing mix-up of recharge tubes.

Means for Solving Problem

To achieve the above object, the present invention provides a recharge tube stocker for storing and managing a recharge tube used for a single crystal pulling apparatus, comprising:

an inlet-outlet section for taking the recharge tube in the recharge tube stocker and taking the recharge tube out of the recharge tube stocker;

a storage means for storing the recharge tube;

a raw-material charging means for charging the recharge tube with a raw material;

a weighing means for weighing a weight of the raw material charged into the recharge tube;

a transferring means for enabling a transfer of the recharge tube, being taken in through the inlet-outlet section, among the inlet-outlet section, the raw-material charging means, and the storage means; and a managing means for collectively managing storage information on the recharge tube stored in the storage means.

With such a recharge tube stocker, recharge tubes can be stored and managed in a space saving manner. It is also possible to prevent taking time for searching for a required recharge tube and prevent causing mix-up of recharge tubes since the storage information on the recharge tubes is collectively managed.

It is preferable that the inlet-outlet section be capable of delivering the recharge tube to the transferring means from a carriage for carrying the recharge tube, with the recharge tube being empty and being suspended, and be capable of delivering the recharge tube from the transferring means to the carriage, with the recharge tube being charged with the raw material and being suspended.

With such a recharge tube stocker, a recharge tube can be delivered smoothly between the transferring means and the carriage.

It is preferable that the transferring means have a transferring device capable of transferring the recharge tube among the inlet-outlet section, the raw-material charging means, and the storage means, with the recharge tube being suspended.

With such a recharge tube stocker, a recharge tube can be transferred among the inlet-outlet section, the raw-material charging means, and the storage means in a more space saving manner.

It is preferable that the raw-material charging means have an inclining means capable of inclining the recharge tube to a prescribed angle for ease of charging the recharge tube with the raw material when the recharge tube is charged with the raw material.

With such a recharge tube stocker, a recharge tube can be charged with a raw material more efficiently.

It is preferable that the raw-material charging means have a function to rotate and/or swing the recharge tube so as to charge the recharge tube with the raw material uniformly when the recharge tube is charged with the raw material.

With such a recharge tube stocker, it can be more certain to charge a recharge tube with a taw material uniformly.

It is preferable that the weighing means have a load cell to weigh the weight of the raw material charged into the recharge tube.

With such a load cell, it is possible to weigh the weight of a raw material charged into a recharge tube.

It is preferable that the storage means have:

a storage rack capable of housing the recharge tube being empty or charged with the raw material and being suspended; and a clean unit capable of keeping a cleanness degree of an atmosphere in the storage rack at class 100 or less, and the clean unit have an air filter and/or a chemical filter.

With such a recharge tube stocker, recharge tubes can be stored in a more space saving manner. Since a recharge tube can be stored in an atmosphere with a higher cleanness degree, the raw material charged into the recharge tube can be prevented from contamination by the atmosphere more securely. With a chemical filter installed thereto, the raw material charged into the recharge tube can also be prevented from contamination by chemical substances in the atmosphere more securely.

It is preferable that the storage information collectively managed with the managing means include at least a position of the recharge tube stored in the storage means and the weight of the raw material charged into the recharge tube.

With such a recharge tube stocker, a required recharge tube can be withdrawn more securely without taking time for searching for the recharge tube and without causing mix-up.

Effects of Invention

With the recharge tube stocker of the present invention, recharge tubes can be stored and managed in a space saving manner. Since the storage information on the recharge tubes is collectively managed, it is possible to prevent taking time for searching for a required recharge tube and prevent causing mix-up of recharge tubes. In addition, since recharge tubes can be stored in the recharge tube stocker, the number of carriages held therein can be requisite minimum.

DESCRIPTION OF EMBODIMENTS

Hereinafter, embodiments of the present invention will be described, but the present invention is not limited thereto.

As described above, after charged with a raw material, recharge tubes have been stored and managed while loaded on each carriage. In such a case, it is necessary to provide carriages as many as the recharge tubes and a space for parking the carriages. Additionally, withdrawing a required recharge tube takes time for searching for the recharge tube and involves a risk for causing mix-up.

Accordingly, the present inventors have repeated earnest studies to solve such problems. As a result, they have conceived that recharge tubes can be stored and managed in a space saving manner with a recharge tube stocker in which recharge tubes are stored by a storage means and the storage information on the recharge tubes to be stored is collectively managed by a managing means, which makes it possible to prevent taking time for searching for a required recharge tube and prevent causing mix-up of recharge tubes. The inventors have minutely investigated the best mode for carrying out these; thereby completing the present invention.

Figure 1:
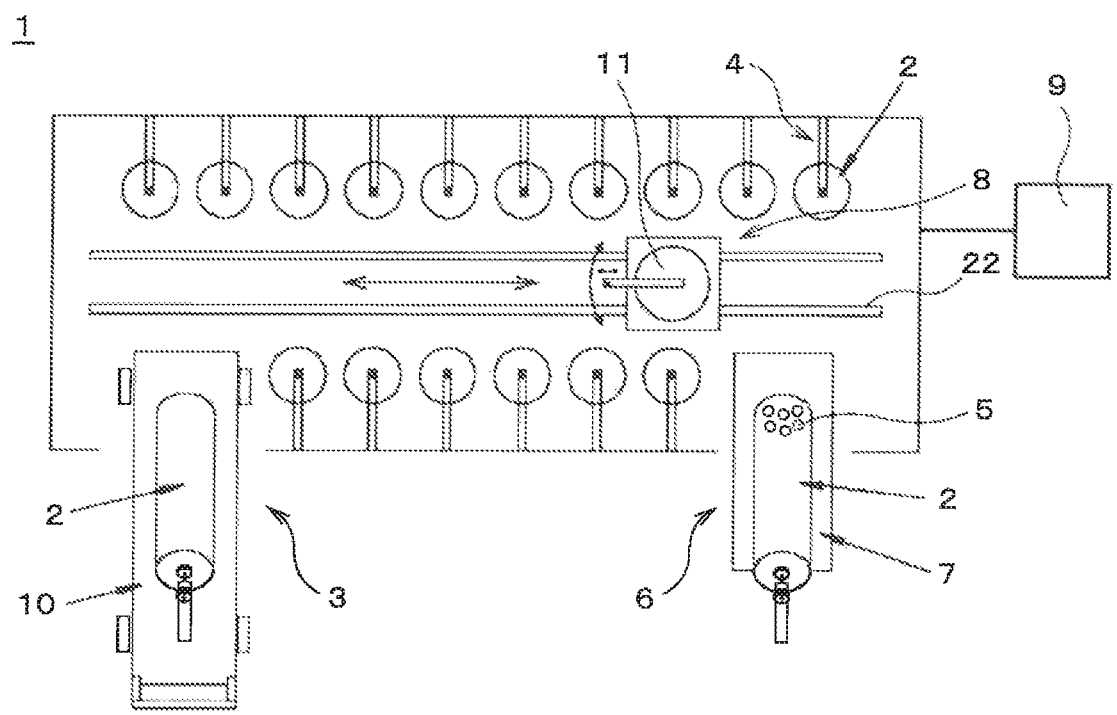
FIG. 1 is a schematic diagram to show an example of a recharge tube stocker of the present invention.

As shown in FIG. 1, a recharge tube stocker 1 of the present invention has: an inlet-outlet section 3 for taking a recharge tube 2 in the recharge tube stocker 1 and taking the recharge tube 2 out of the recharge tube stocker 1; a storage means 4 for storing the recharge tube 2; a raw-material charging means 6 for charging the recharge tube 2 with a raw material 5; a weighing means 7 for weighing the weight of the raw material 5 charged into the recharge tube 2; a transferring means 8 for enabling a transfer of the recharge tube 2, being taken in through the inlet-outlet section 3, among the inlet-outlet section 3, the raw-material charging means 6, and the storage means 4; and a managing means 9 for collectively managing storage information on the recharge tube 2 stored in the storage means 4.

As the managing means 9, it is possible to use, for example, an inventory control system with a personal computer, etc. This is suitable for collectively managing the information on a material charged into the recharge tube 2, etc.

It is preferable that the storage information collectively managed by the managing means 9 include at least the position of the recharge tube 2 stored in the storage means 4 and the weight of the raw material 5 charged into the recharge tube 2. More specifically, it is possible to collectively manage the storage information including the kind of the raw material 5, the manufacturing lot number, and the size of the recharge tube 2 by the managing means 9.

With such a recharge tube stocker, the required recharge tube 2 can be withdrawn more securely without taking time for searching for the recharge tube and without causing mix-up.

Figure 2:
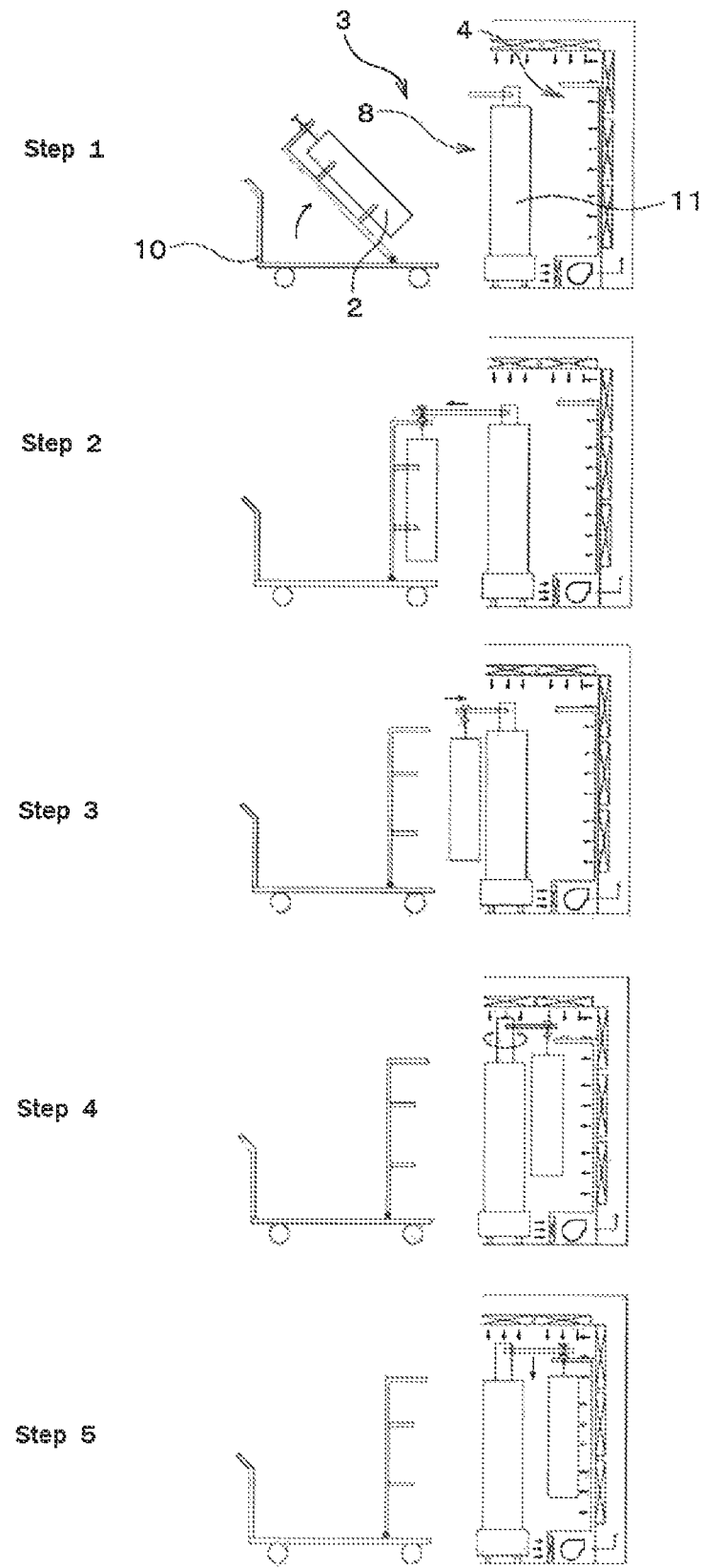
FIG. 2 shows explanatory drawings to illustrate a taking-in operation of a recharge tube at an inlet-outlet section in the recharge tube stocker of the present invention.

As shown in FIG. 2, it is preferable that the inlet-outlet section 3 be capable of delivering the recharge tube 2 to the transferring means 8 from a carriage 10 for carrying the recharge tube 2, with the recharge tube 2 being empty and being suspended, and be capable of delivering the recharge tube 2 from the transferring means 8 to the carriage 10, with the recharge tube 2 being charged with the raw material 5 and being suspended.

With such a recharge tube stocker, the recharge tube 2 can be delivered smoothly between the transferring means 8 and the carriage 10.

The transferring means 8 preferably has a transferring device 11 capable of transferring the recharge tube 2 among the inlet-outlet section 3, the raw-material charging means 6 (see FIG. 3), and the storage means 4, with the recharge tube 2 being suspended. As shown in FIG. 1, for example, the transferring device 11 is allowed to run a transferring course 22 in the recharge tube stocker 1. The transferring device 11 is allowed to revolve, with the recharge tube 2 being suspended therefrom as shown in FIG. 2.

With such a recharge tube stocker the recharge tube 2 can be transferred among the inlet-outlet section 3, the raw-material charging means 6, and the storage means 4 in a space saving manner. It is also possible to shorten the time compared to the conventional case of moving a recharge tube with a carriage to the depository since the recharge tube 2 after the raw-material charging operation can be transferred to the storage means 4 with the transferring device 11.

Figure 3:
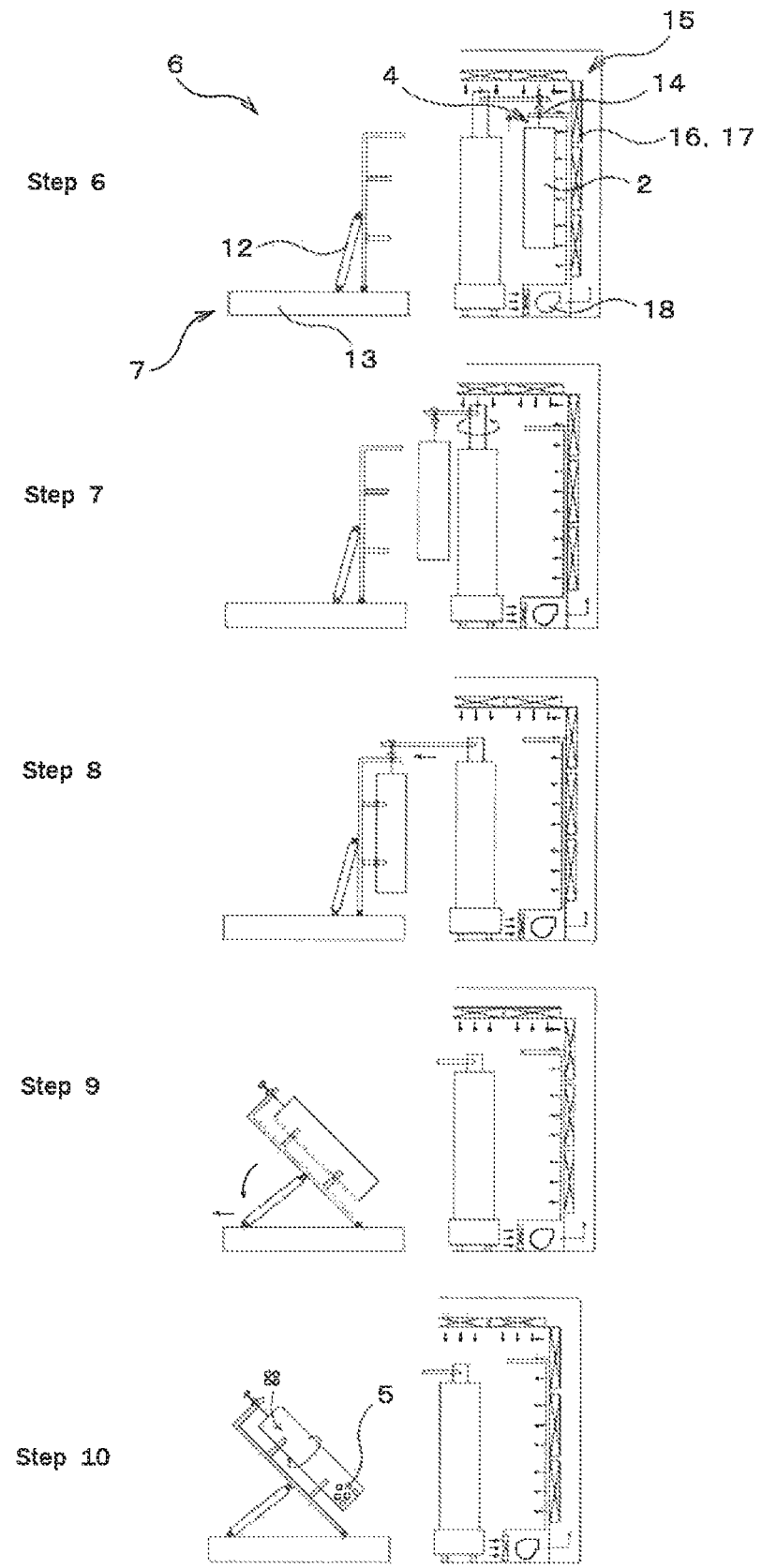
FIG. 3 shows explanatory drawings to illustrate a charging operation of a recharge tube with a raw material by a raw-material charging means in the recharge tube stocker of the present invention.

As shown in FIG. 3, the raw-material charging means 6 preferably has an inclining means 12 capable of inclining the recharge tube 2 to a prescribed angle for ease of charging the recharge tube 2 with a raw material when the recharge tube 2 is charged with the raw material.

With such a recharge tube stocker, the recharge tube 2 can be charged with a raw material more efficiently. The recharge tube 2 can be charged with a raw material by human hand, for example. Alternatively, the charging can be performed automatically by using a charging machine or the like, and is not particularly limited.

The raw-material charging means 6 preferably has a function to rotate and/or swing the recharge tube 2 so as to charge the recharge tube 2 with the raw material uniformly when the recharge tube 2 is charged with the raw material 5.

Figure 4:
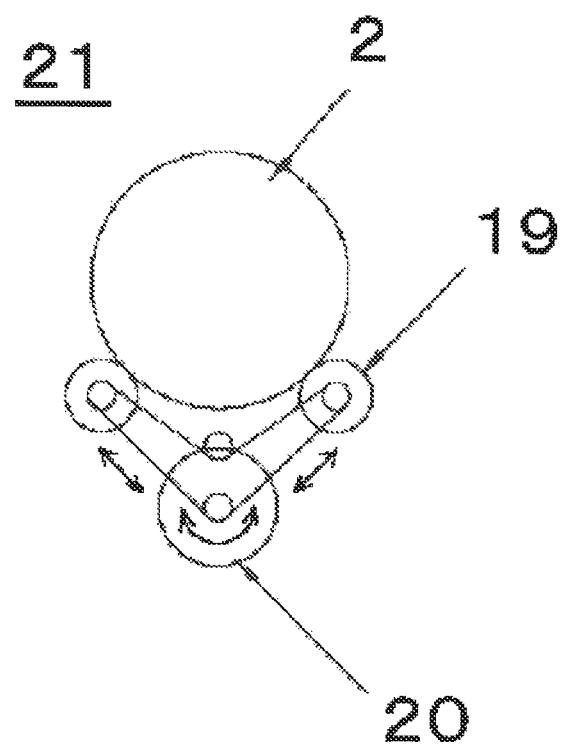
FIG. 4 is a schematic diagram to show a swinging means capable of rotating and/or swinging a recharge tube when the recharge tube is charged with a raw material.

With such a recharge tube stocker, it can be more certain to charge the recharge tube 2 with the raw material 5 uniformly. The recharge tube 2 can be rotated and/or swung, for example, with a swinging means 21 provided with rollers 19 and a motor 20 configured to rotate the rollers 1 as shown in FIG. 4.

As shown in FIG. 3, the weighing means 7 preferably has a load cell 13 to weigh the weight of the raw material 5 charged into the recharge tube 2. The load cell 13 can have a function to display the measured weight. In this manner, the load cell 13 makes it possible to weigh the weight of the raw material 5 charged into the recharge tube 2.

The storage means 4 preferably has: a storage rack 14 capable of housing the recharge tube 2 being empty or charged with the raw material 5 and being suspended; and a clean unit 15 capable of keeping a cleanness degree of an atmosphere in the storage rack 14 at class 100 or less, wherein the clean unit 15 has an air filter 16 and/or a chemical filter 17. It is preferable that the chemical filter 17 can remove chemical substances in the atmosphere.

With such a recharge tube stocker, the recharge tubes 2 can be stored in a more space saving manner. It is also possible to store the recharge tubes 2 in an atmosphere with a higher cleanness degree without being influenced by an indoor environment. Accordingly, the raw material 5 charged into the recharge tube 2 can be prevented from contamination by the atmosphere more securely. With the chemical filter 17 installed, the raw material 5 charged into the recharge tube 2 can also be prevented from contamination by chemical substances in the atmosphere more securely.

The clean unit 15 can be designed in such a way that the atmosphere in the storage rack 14 is aspirated by a circulation fan 18 and is supplied to the storage rack 14 again after passing through the air filter 16 and/or the chemical filter 17, for example.

With the recharge tube stocker of the present invention described above, recharge tubes can be stored and managed in a space saving manner. Since the storage information on the recharge tubes is collectively managed, it is possible to prevent taking time for searching for a required recharge tube and prevent causing mix-up of recharge tubes. In addition, since recharge tubes can be stored in the recharge tube stocker, the number of carriages held therein can be requisite minimum.

The following briefly explains an example of a method for storing and managing a recharge tube by using the recharge tube stocker of the present invention as described above, but the present invention is not limited thereto.

First, the taking-in operation of the recharge tube 2 at the inlet-outlet section 3 is described by reference to FIG. 2. To begin with, the carriage 10 loaded with the empty recharge tube 2 is set to the inlet-outlet section (Step 1). The recharge tube 2 is delivered to the transferring device 11 while being suspended (Steps 2, 3). The recharge tube 2 is reloaded to any storage rack 14 with the transferring device 11 while being suspended (Step 4), and is stored in a state of being suspended (Step 5).

Then, the charging operation of the recharge tube 2 with the raw material 5 at the raw-material charging means 6 is described by reference to FIG. 3. First, the empty recharge tube 2, which is stored in the storage rack 14 while being suspended, is transferred to the raw-material charging means 6 by the transferring device 11 (Steps 6 to 8).

After the recharge tube 2 is received by the raw-material charging means 6, the recharge tube 2 is inclined to a prescribed angle by the inclining means 12 for ease of charging the recharge tube 2 with a raw material (Step 9). Then, the recharge tube 2 is rotated and/or swung to be charged with the raw material 5 such that the raw material 5 becomes uniform in the recharge tube 2 (Step 10). In this event, the weight of the raw material 5 charged into the recharge tube 2 is weighed with the load cell 13.

Then, the recharge tube 2 after charged with the raw material 5 is housed and stored in the storage rack 14 in the opposite order to the step of raw-material charging operation in FIG. 3. The position of the recharge tube 2 stored in this event is collectively managed by the managing means, together with information on the weight of the raw material 5 charged into the recharge tube 2.

Subsequently, the recharge tube 2, which has been charged with the raw material 5 and stored in the storage rack 14, is taken out in the opposite order to the step of taking-in operation in FIG. 2. In this event, the recharge tube 2 to be taken out is identified correctly by using the storage information on the recharge tube managed collectively by the managing means.

EXAMPLE

Hereinafter, the present invention will be more specifically described by showing Example and Comparative Example of the present invention, but the present invention is not limited thereto.

EXAMPLE

By using the recharge tube stocker of the present invention as shown in FIG. 1, 100 recharge tubes were stored and managed.

Each of the recharge tubes was stored by using a storage rack, with the recharge tube being suspended. The cleanness degree of the atmosphere in the storage rack was kept at class 100 or less by the clean unit. The storage information on the position of each recharge tube to be stored and the weight of the raw material charged into each recharge tube were collectively managed by the managing means.

In this event, the area of the whole recharge tube stocker was measured, together with the space required for one recharge tube to be stored and managed.

As the result, the space required for one recharge tube to be stored and managed was: 0.4 m×0.5 m=0.2 m² per tube. The area of the whole recharge tube stocker was 50 m².

COMPARATIVE EXAMPLE

While loaded on the respective carriages, 100 recharge tubes were stored and managed. In this event, the space required for one recharge tube to be stored and managed was measured.

As the result, the space required for one recharge tube to be stored and managed was: 1.5 m×0.6 m=0.9 m² per tube. The space of 90 m² was necessary for the whole area of 100 recharge tubes.

As described above, the recharge tubes were successfully stored and managed in a more space saving manner in Example than in Comparative Example. In Comparative Example, the recharge tubes to be stored and managed each required own carriage. On the other hand, the number of carriages held in Example could be 20 to 30, and could be requisite minimum since the recharge tube stocker was capable of storing the recharge tubes.

In Example, the storage information on the recharge tubes were managed collectively, making it possible to prevent taking time for searching for a required recharge tube and prevent causing mix-up of the recharge tubes.

In Comparative Example, the cleanness degree of the room for storing the recharge tubes was at class 1000 to 10000. On the other hand, the recharge tubes were successfully stored with the cleanness degree being kept at class 100 or less in Example by installing the clean unit.

It is to be noted that the present invention is not limited to the foregoing embodiments. The embodiments are just exemplary, and any examples that have substantially the same structure and demonstrate the same functions and effects as those of the technical concept described in claims of the present invention are included in the technical scope of the present invention.

The invention claimed is:

1. A recharge tube stocker for storing and managing a recharge tube used for a single crystal pulling apparatus, the recharge tube stocker comprising:
    an inlet-outlet section for taking the recharge tube in the recharge tube stocker and taking the recharge tube out of the recharge tube stocker;
    a storage unit configured to store the recharge tube;
    a raw-material charger configured to charge the recharge tube with a raw material;
    a weight scale configured to weigh a weight of the raw material charged into the recharge tube;
    a transferring device configured to enable a transfer of the recharge tube, being taken in through the inlet-outlet section, among the inlet-outlet section, the raw-material charger, and the storage unit; and
    an inventory control processor configured to collectively manage storage information on the recharge tube stored in the storage unit.

2. The recharge tube stocker according to claim 1, further comprising a carriage for carrying the recharge tube, wherein the inlet-outlet section is capable of delivering the recharge tube from the carriage to the transferring device, with the recharge tube being empty and being suspended, and is capable of delivering the recharge tube from the transferring device to the carriage, with the recharge tube being charged with the raw material and being suspended.

3. The recharge tube stocker according to claim 1, wherein the transferring device has a transferring unit configured to transfer the recharge tube among the inlet-outlet section, the raw-material charger, and the storage unit, with the recharge tube being suspended.

4. The recharge tube stocker according to claim 2, wherein the transferring device has a transferring unit configured to transfer the recharge tube among the inlet-outlet section, the raw-material harger, and the storage unit, with the recharge tube being suspended.

5. The recharge tube stocker according to claim 1, wherein the raw-material charger has an incliner configured to incline the recharge tube to a prescribed angle for ease of charging the recharge tube with the raw material when the recharge tube is charged with the raw material.

6. The recharge tube stocker according to claim 2, wherein the raw-material charger has an incliner configured to incline the recharge tube to a prescribed angle for ease of charging the recharge tube with the raw material when the recharge tube is charged with the raw material.

7. The recharge tube stocker according to claim 3, wherein the raw-material charger has an incliner configured to incline the recharge tube to a prescribed angle for ease of charging the recharge tube with the raw material when the recharge tube is charged with the raw material.

8. The recharge tube stocker according to claim 4, wherein the raw-material charger has an incliner configured to incline the recharge tube to a prescribed angle for ease of charging the recharge tube with the raw material when the recharge tube is charged with the raw material.

9. The recharge tube stocker according to claim 1, wherein the raw-material charger is configured to at least one of rotate and swing the recharge tube so as to charge the recharge tube with the raw material uniformly when the recharge tube is charged with the raw material.

10. The recharge tube stocker according to claim 2, wherein the raw-material charger is configured to at least one of rotate and swing the recharge tube so as to charge the recharge tube with the raw material uniformly when the recharge tube is charged with the raw material.

11. The recharge tube stocker according to claim 3, wherein the raw-material charger is configured to at least one of rotate and swing the recharge tube so as to charge the recharge tube with the raw material uniformly when the recharge tube is charged with the raw material.

12. The recharge tube stocker according to claim 5, wherein the raw-material charger is configured to at least one of rotate and swing the recharge tube so as to charge the recharge tube with the raw material uniformly when the recharge tube is charged with the raw material.

13. The recharge tube stocker according to claim 1, wherein the weight scale has a load cell that measures the weight of the raw material charged into the recharge tube.

14. The recharge tube stocker according to claim 2, wherein the weight scale has a load cell that measures the weight of the raw material charged into the recharge tube.

15. The recharge tube stocker according to claim 3, wherein the weight scale has a load cell that measures the weight of the raw material charged into the recharge tube.

16. The recharge tube stocker according to claim 5, wherein the weight scale has a load cell that measures the weight of the raw material charged into the recharge tube.

17. The recharge tube stocker according to claim 9, wherein the weight scale has a load cell that measures the weight of the raw material charged into the recharge tube.

18. The recharge tube stocker according to claim 1, wherein the storage unit comprises:
    a storage rack capable of housing the recharge tube being empty or charged with the raw material and being suspended; and
    a cleaner configured to keep a cleanness degree of an atmosphere in the storage rack at class 100 or less, cleaner including at least one of an air filter and a chemical filter.

19. The recharge tube stocker according to claim 1, wherein the storage information collectively managed with the inventory control processor includes at least a position of the recharge tube stored in the storage unit and the weight of the raw material charged into the recharge tube.

* * * * *